(12) United States Patent
Kim et al.

(10) Patent No.: US 7,871,490 B2
(45) Date of Patent: Jan. 18, 2011

(54) INDUCTIVELY COUPLED PLASMA GENERATION SYSTEM WITH A PARALLEL ANTENNA ARRAY HAVING EVENLY DISTRIBUTED POWER INPUT AND GROUND NODES AND IMPROVED FIELD DISTRIBUTION

(75) Inventors: Harqkyun Kim, Cypress, CA (US); Yunju Ra, Irvine, CA (US)

(73) Assignee: Top Engineering Co., Ltd., Gumi-si, Gyeongsangbuk-do (KR)

( * ) Notice: Subject to any disclaimer, the term of this patent is extended or adjusted under 35 U.S.C. 154(b) by 1046 days.

(21) Appl. No.: 11/338,085

(22) Filed: Jan. 24, 2006

(65) Prior Publication Data
US 2006/0124059 A1    Jun. 15, 2006

Related U.S. Application Data

(63) Continuation-in-part of application No. 10/391,383, filed on Mar. 18, 2003, now abandoned.

(51) Int. Cl.
C23C 16/00 (2006.01)
H01L 21/306 (2006.01)

(52) U.S. Cl. ............................. 156/345.48; 118/723 I; 118/723 AN; 315/111.51

(58) Field of Classification Search ............ 315/111.51; 118/723 I, 723 IR, 723 AN; 156/345.48, 156/345.49
See application file for complete search history.

(56) References Cited

U.S. PATENT DOCUMENTS

| 5,571,366 | A | 11/1996 | Ishii et al. | |
|---|---|---|---|---|
| 5,637,961 | A | 6/1997 | Ishii et al. | |
| 5,753,044 | A | * 5/1998 | Hanawa et al. | 118/723 I |
| 6,288,493 | B1 | 9/2001 | Lee et al. | |
| 6,291,793 | B1 | * 9/2001 | Qian et al. | 219/121.43 |
| 6,310,577 | B1 | 10/2001 | Ra | |
| 6,406,545 | B2 | 6/2002 | Shoda et al. | |
| 6,459,066 | B1 | 10/2002 | Khater et al. | |
| 6,469,448 | B2 | 10/2002 | Taguchi et al. | |
| 6,685,798 | B1 | 2/2004 | Holland et al. | |
| 2002/0018025 | A1 | 2/2002 | Matsuda et al. | |
| 2002/0189763 | A1 | 12/2002 | Kwon et al. | |

\* cited by examiner

*Primary Examiner*—Luz L. Alejandro
(74) *Attorney, Agent, or Firm*—KED & Associates, LLP

(57) ABSTRACT

An antenna adapted to apply uniform electromagnetic fields to a volume of gas and including radiating elements connected in parallel with evenly distributed input terminals for receiving electromagnetic energy into the antenna and output terminals for grounding. In the illustrative embodiment, the antenna has three radiating elements connected in parallel. Each radiating element is a conductor wound in a circular shape with the same diameter. Each radiating element is connected to the input terminal on one end and an output terminal on the other. The input terminal of the second element is 120° rotated counterclockwise from the first and the input terminal of the third is rotated by 120° counterclockwise from the second. The ground terminals of each radiating elements are located in the same manner as the input terminals. Each element is feed by a feeder coil. While the antenna elements are disposed around a chamber, the feeder coils are disposed above the chamber to improved the distribution of electromagnetic energy within the chamber.

10 Claims, 4 Drawing Sheets

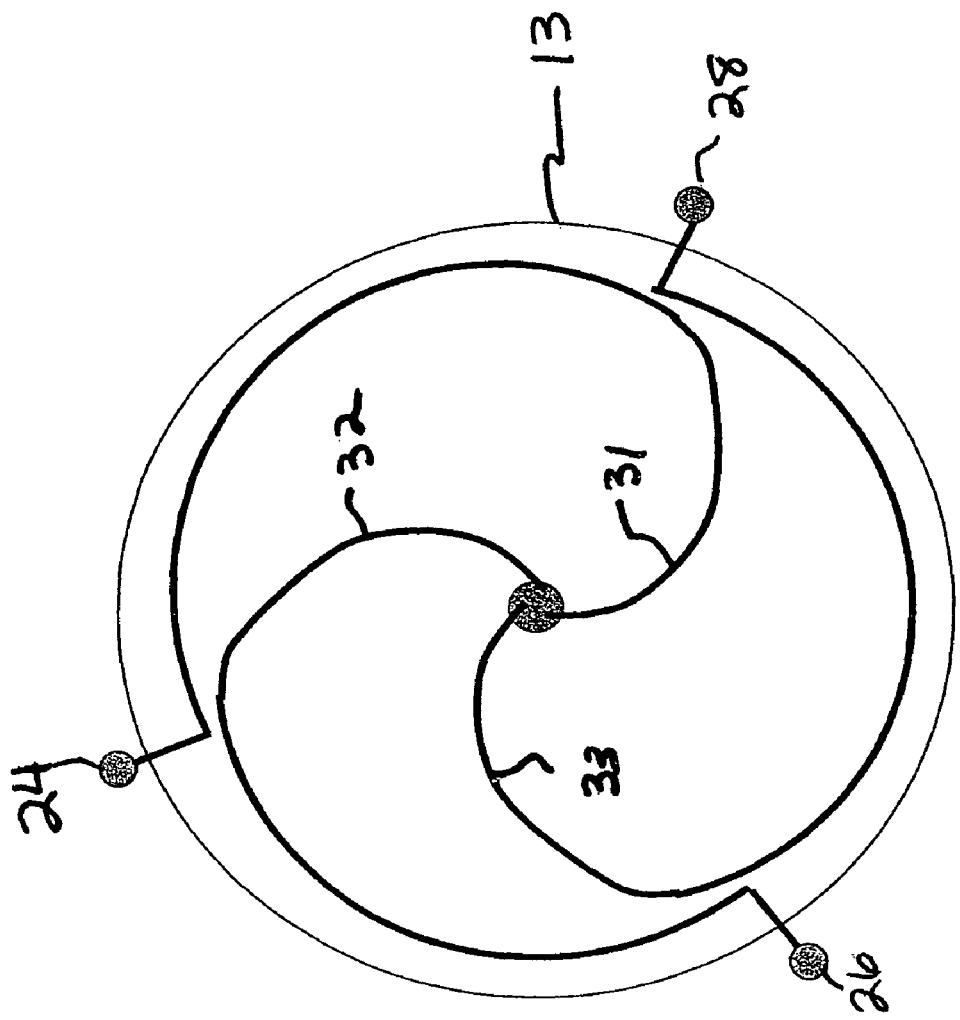
FIG. 4 Top view of the antenna

INDUCTIVELY COUPLED PLASMA GENERATION SYSTEM WITH A PARALLEL ANTENNA ARRAY HAVING EVENLY DISTRIBUTED POWER INPUT AND GROUND NODES AND IMPROVED FIELD DISTRIBUTION

REFERENCE TO RELATED APPLICATION

This is a continuation-in-part of INDUCTIVELY COUPLED PLASMA GENERATION SYSTEM WITH A PARALLEL ANTENNA ARRAY HAVING EVENLY DISTRIBUTED POWER INPUT AND GROUND NODES Ser. No. 10/391,383, filed Mar. 18, 2003 now abandoned by Harqkyun Kim et al.

BACKGROUND OF THE INVENTION

1. Field of the Invention

The present invention relates to plasma processing systems. More specifically, the present invention relates to plasma sources used for plasma etching, chemical vapor deposition, photo-resist stripping and other applications relating to semiconductor, flat panel display, printed circuit board and other fabrication processes.

2. Description of the Related Art

Plasmas sources capable of uniform coupling of electromagnetic energy to plasmas are needed for many plasma processes such as plasma etching, plasma enhanced chemical vapor deposition, physical vapor deposition, photo-resist stripping and surface treatments for many applications. Illustrative applications include silicon and compound semiconductor fabrication, flat panel display fabrication including active matrix liquid crystal display, plasma display panels, field emission displays etc. Additional applications include hard disk drive head and media manufacturing, micro-electromechanical system manufacturing and printed wiring board fabrication.

A plasma source typically includes a radio frequency antenna, a dielectric window and a volume of gas. An electric field from an impedance matched power supply is applied to the gas by the antenna through the dielectric tube. The application of the electric field to the gas generates two fields of interest with respect to plasma processing: time varying electromagnetic fields and capacitive electric fields. Free electrons gain energy by these electromagnetic fields and generate ions by collision with neutral gases, thereby generating plasmas. The inductive technique using a time varying electromagnetic field is known to be more efficient in the production of plasma than the capacitive coupling technique using a capacitive electrostatic field. A typical plasma etcher uses an additional electric field capacitively coupled to the substrate to increase ion energy.

Inductively coupled plasma sources typically use an antenna wound in circular spiral shape with an input terminal for receiving electromagnetic power at one end of the antenna and an output terminal for grounding at the other. This type of antenna induces a large potential difference between input and output terminals resulting in strong electric fields. Ions and electrons gaining energy through the interaction with these fields cause non-uniformity in the spatial energy distribution of plasmas which adversely impacts process results.

Hence, there is a need in the art for a system or technique for uniformly coupling electromagnetic energy for inductive generation of uniform plasmas. This need is addressed by the above-identified parent application of which this application is a continuation-in-part. However, a need remains for further improvements in the distribution of electromagnetic energy for inductive generation of uniform plasmas.

SUMMARY OF THE INVENTION

The need in the art is addressed by the antenna of the present invention. The inventive antenna is adapted to apply a uniform electromagnetic field to a volume of gas and includes an array of radiating elements with input terminals for receiving electrical energy into each radiating element and output terminal for grounding. The inventive antenna includes an array of radiating elements in the shape of circular, semicircular or rectangular loops connected in parallel.

In the illustrative embodiment, the antenna has three radiating elements. Each radiating element includes a conductor wound in a single turn circle around a dielectric tube with the same diameter. In accordance with the invention, each element of the inventive has a one-half turn coil disposed over said tube to further improve the distribution of the plasma. The input terminal of the second element is rotated 120° counterclockwise from the first and the input terminal of the third is rotated counterclockwise by 120° from the second. The ground terminal of each radiating element is located in the same manner as the input terminal.

The inventive antenna is adapted for use in a plasma processing system comprising a vacuum chamber, a gas disposed within the vacuum chamber, a dielectric tube disposed on the vacuum chamber, and a power circuit. The power circuit includes a source of radio frequency (RF) power, a switch and an impedance matching circuit. The impedance matching circuit efficiently couples power from the RF supply to the antenna.

The inventive antenna provides uniform coupling of electromagnetic power by spreading out high potential input terminals and ground terminals evenly along the circumference of a process tube, therefore resulting in uniform plasma density and energy across the entire substrate surface under a wide range of processing conditions.

BRIEF DESCRIPTION OF THE DRAWINGS

FIG. 4 is a top view of the antenna of FIG. 3.

DESCRIPTION OF THE INVENTION

Illustrative embodiments and exemplary applications will now be described with reference to the accompanying drawings to disclose the advantageous teachings of the present invention.

While the present invention is described herein with reference to illustrative embodiments for particular applications, it should be understood that the invention is not limited thereto. Those having ordinary skill in the art and access to the teachings provided herein will recognize additional modifications, applications, and embodiments within the scope thereof and additional fields in which the present invention would be of significant utility.

Figure 1:
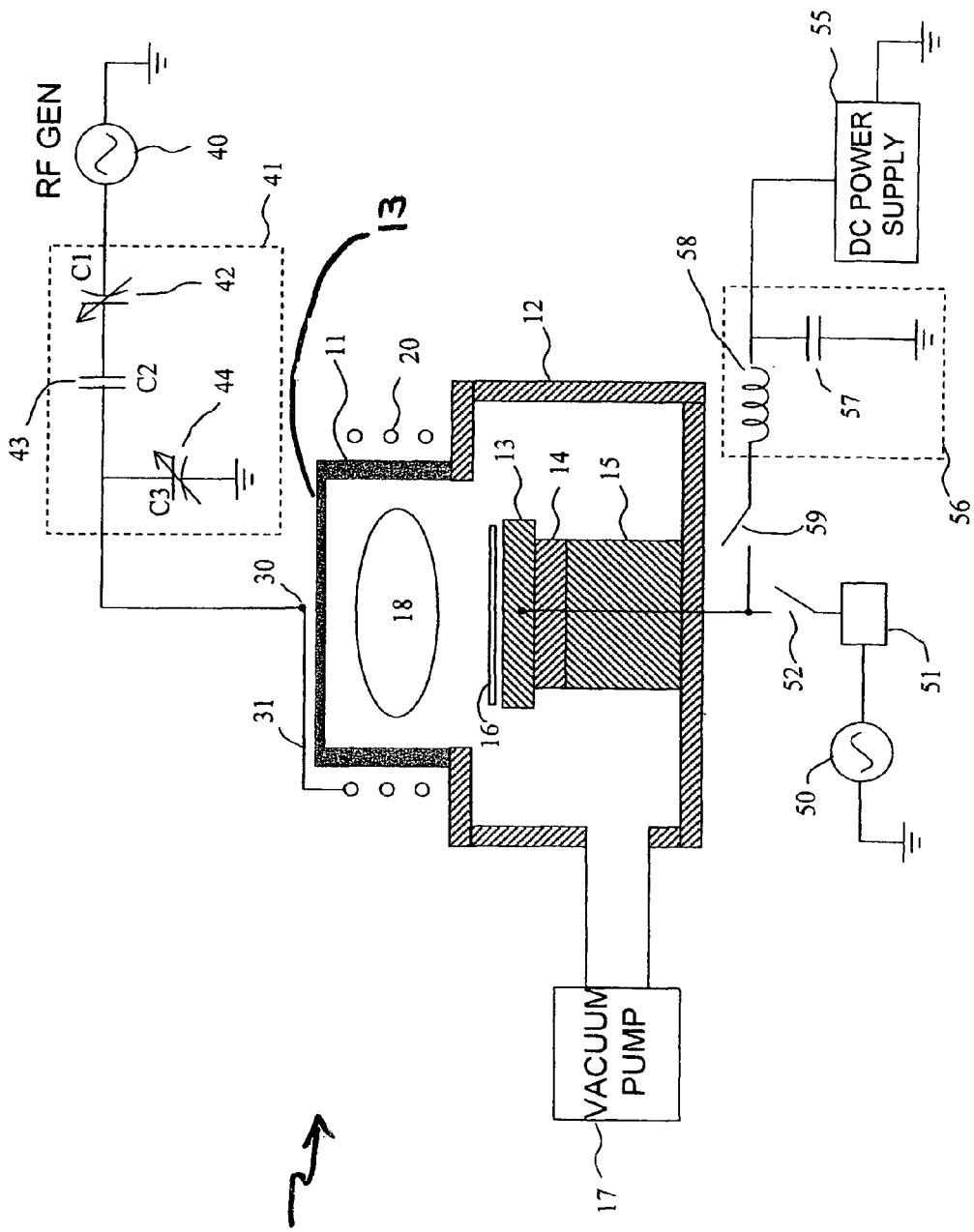
FIG. 1 is a schematic sectional view of an illustrative embodiment of an inductively coupled plasma reactor implemented in accordance with the teachings of the present invention.

FIG. 1 is a schematic sectional view of an inductively coupled plasma reactor in accordance with an illustrative embodiment of the present invention. The system 10 is designed for plasma processes such as etch and plasma CVD. As shown in FIG. 1, the system consists of a plasma source 18 and a process chamber 12 for plasma generation and wafer processing. Plasma source 18 is made of a dielectric tube 11, an antenna 20, and a gas injector 10. Process gases are injected through the gas injector 13 to the process chamber 12. In the best mode, the gas injector 13 is made of dielectric material to facilitate the creation of an electromagnetic field within the chamber 12 by half-turns of the antenna 20 disposed on top of the chamber 12 as discussed more fully below.

The system operates at low pressure typically around mTorr range by using a vacuum pump 17. RF bias power is provided by a supply 50. This allows for RF bias power to be applied to control the ion energy in the plasma independently from an RF power source 40. Plasma 18 is generated by an inductively coupled electric field produced by an antenna 20.

Figure 2:
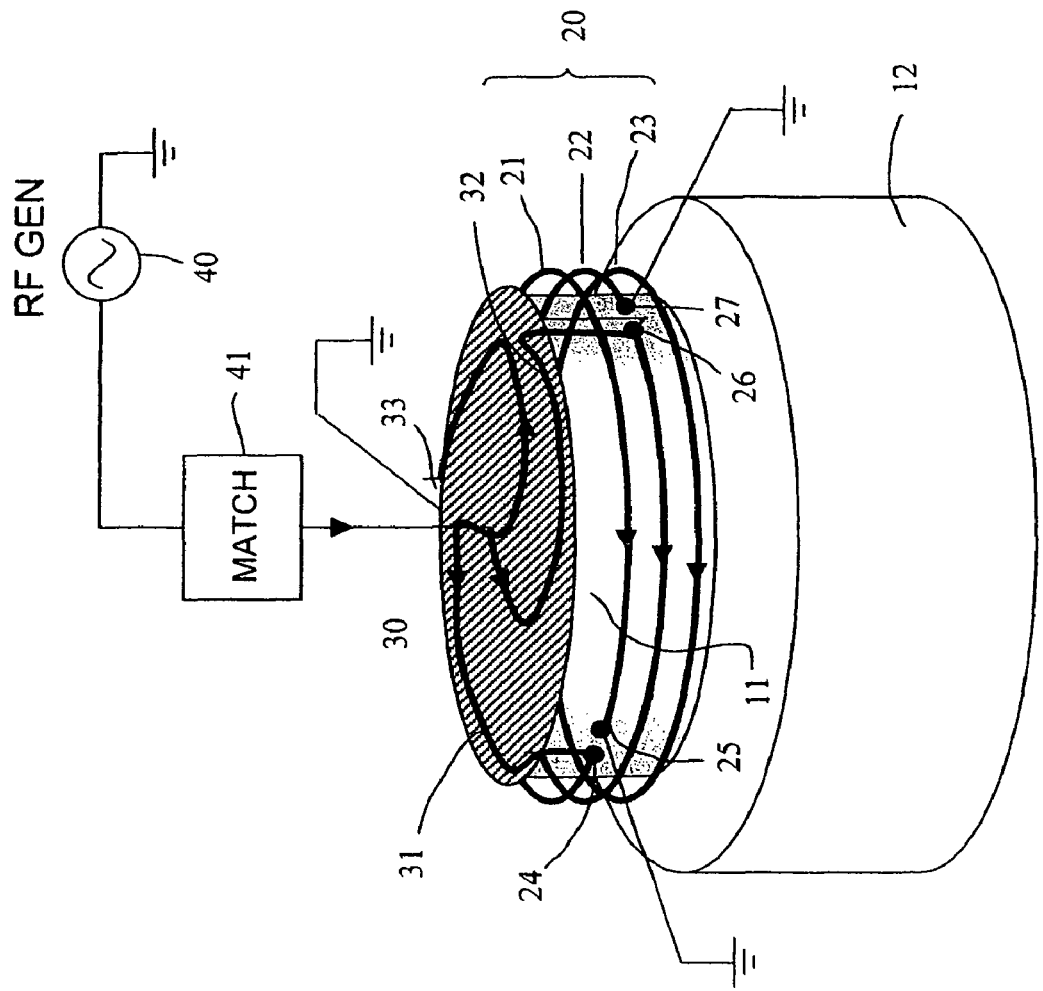
FIG. 2 is an illustrative embodiment of an antenna configuration adapted for use with the plasma reactor of FIG. 1 in accordance with the teachings of the present invention.

FIG. 2 shows an illustrative embodiment of the antenna of the plasma reactor in accordance with the teachings of the present invention. The antenna 20 consists of multiple inductive parallel coils 21, 22 and 23 wrapped around a cylindrical dielectric tube 11. The present invention is not limited to the shape of the dielectric tube. Other shapes may be used without departing from the scope of the present teachings.

In a conventional inductive antenna, a spiral coil with multiple turns is wrapped around a plasma generation chamber. Typically, one end of the inductive coil is connected to an RF power source and another end of the coil is connected to system ground. Therefore, there is only one RF input and one ground output in the continuous spiral coil. In that case, because the total coil length is large, transmission line properties of the induction coil result in voltage and current standing waves along its length. The variations in current with position along the coil lead to asymmetries in the induced electromagnetic fields, which, in turn, can lead to asymmetries in the power density of plasma and non-uniformity in the processing of components.

The inventive antenna 20 includes an array of radiating elements (coils) in the shape of circular, semicircular or rectangular loops connected in parallel. In the illustrative embodiment, the antenna has three radiating elements. Each radiating element includes a conductor wound in a single turn circle with the same diameter and preferrably, each inductive coil has only a single turn or less in order to reduce the transmission line effect. That is, in the best mode, each coil has a single turn or less to reduce the total inductance of the coil. Nonetheless, those skilled in the art will appreciate that the present teachings are not limited to the number of coils or the number of turns thereof.

Each coil 21, 22 and 23 is fed by a half-turn coil feeder segment 31, 32 and 33 respectively. The half-turn segments are disposed on top of the chamber along a plane generally transverse to a longitudinal axis coaxial to the coils 21, 22 and 23. Those skilled in the art will appreciate that the feeder coils 31, 32 and 33 could be embedded in the dielectric 13 without departing from the scope of the present teachings. In addition, the feeder coils may have additional turns without departing from the scope of the present teachings.

The coils 21, 22, and 23 are arranged in parallel around the plasma generation reactor 11. Three different input nodes 24, 26, and 28 are provided for receiving RF energy and three different output nodes 25, 27, and 29 are provided for ground, respectively.

Figure 3:
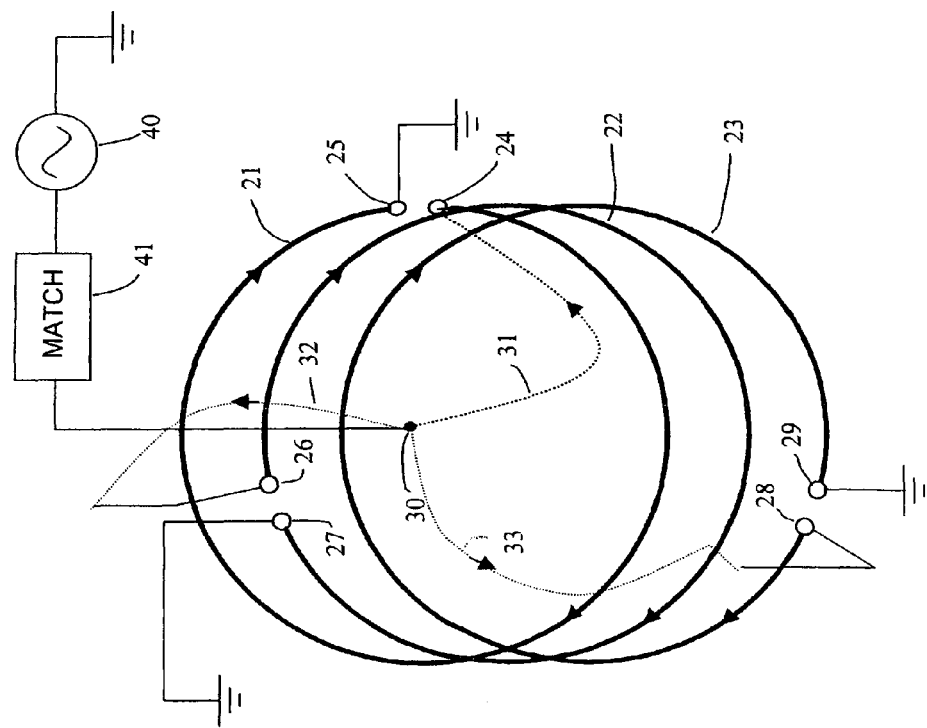
FIG. 3 is a schematic diagram of the antenna coils illustrating even distribution of input/output nodes in accordance with the teachings of the present invention.

FIG. 3 is a schematic diagram of the antenna coils illustrating the even distribution of input/output nodes in accordance with the teachings of the present invention. Each antenna coil of single-turn loop 21, 22 and 23 is provided with a common RF power generator 40 connection via its own RF input nodes 24, 26, and 28 and a connection to ground via output nodes 25, 27, and 29, respectively. An RF impedance match network 41 is connected in series between the RF power generator 40 and a common RF input node 30 for the three antenna coils 21, 22, and 23.

The first coil 21 has an input node 24 for receiving RF energy at one end and an output node 25 connected to ground at the other end. Since it has a circular turn, the two nodes 24 and 25 are close to each other. The second 22 and third 23 coils are configured by 120 deg and 240 deg rotation from the position of the input and output nodes 24 and 25 of the first coil 21 for even distribution. The feeder coils serve to create an electric field near the top of the chamber 12 thereby facilitating an improved distribution of the plasma 18. Therefore, the present invention improves the power deposition symmetry as well as the ion flux uniformity on the surface of wafer 16 (FIG. 1).

In the best mode, the antenna rotation is equal to 360 divided by the number of turns thereof. Nonethesless, those skilled in the art will appreciate that the present invention is not limited thereto. Other antenna rotations and turns ratios may be used without departing from the scope of the present teachings.

The RF current direction along the antenna coils 20 is same for all three loops 21, 22, and 23. The feeder coils 31, 32, and 33 should have the same length from the common RF input point 30 to each RF input node 24, 26, and 28 to avoid destructive interference among the coil currents. This can be implemented by wiring three feeder coils 31, 32, and 33 of same length with a half-turn to make the length from the common input point 30 to each three different RF input nodes 24, 26, and 28 equal.

FIG. 4 is a top view showing the inventive feeder coils 31, 32, and 33 of the antenna 20 with 120 degree angle differences for the input/output nodes thereof. The advantage of this method of evenly distributing the RF input nodes 24, 26, and 28 and ground nodes 25, 27, and 29 of each coil loops 20 is that it minimizes the potential unbalance along the antenna coil 20. Usually, the potential difference between the RF input and output nodes is smaller in the coil with shorter length.

However, some potential difference between the input/output nodes may not be avoided even though a single-turn coil is used. Thus, if the antenna nodes are mounted using a common input and a common output arrangement such as superposition, the potential difference between each input/output nodes will be overlapped and enhanced. This typically results in non-uniform plasma in the wafer process.

However, by the inventive method of using even distribution, if the three pairs of nodes 24/25, 26/27, and 28/29 of each of the coil loops 20 are distributed evenly, the unbalance of total potential can be minimized to get uniform plasma and process results across the entire wafer 16 surface.

The coils are conductive materials such as copper or other suitable conductor. Those of ordinary skill in the art may choose the diameters and number of turns of the coils to suit a particular application. In the best mode, cooling water is flowed through the antenna coils 20. This should allow the coils to deliver up to 2500 W of RF power to a plasma 18.

Returning to FIG. 1, the output of the RF generator 40 is connected to the antenna coils 20 via the matching network 41. In the illustrative embodiment, the matching network 41 includes two series capacitors 42 and 43 (C1 and C2) and a capacitor 44 (C3) connected to ground. Two capacitors 42 and 44 are variable capacitors and the third capacitor 43 is a shunt capacitor with a fixed capacitive value.

In conventional RF systems, ion energy and flux are linked, and cannot be controlled independently. However, the mean ion bombarding energy and its energy distribution should be controlled independently of the ion and neutral fluxes to tailor the film properties such as stress, composition, refractive index, crystallinity, and topography. In the plasma etching, ion energy also needs to be controlled to control etch rate, optimize selectivity, and minimize the device damage. Therefore, it is very important for the plasma process to offer better control of ion energy and couple it from ion flux control.

As shown in FIG. 1, the plasma reactor of this invention contains two auxiliary power sources 50 and 55. Each bias can be selected using switches 52 and 59. The substrate holder, chuck 13, has an anodized surface and it is mounted on chamber bottom 15. Insulation 14 is supplied between chuck 13 and the chamber bottom 15 to isolate the chuck 13 from the chamber ground. The first bias is the "RF bias" power 50 which is applied to the chuck 13 to control ion bombardment energies onto the substrate 16 surface. Independent control over ion bombarding energy can be achieved by biasing a second RF source 50 on the substrate chuck 13. The RF bias power 50 is applied to the substrate chuck 13 to control the energy of ions bombarding the substrate 16 surface. Thus, the present invention provides a wider process window for etching such as etch rate, etch profile, and selectivity.

The second bias is "positive DC voltage". This bias can be used for film deposition by plasma chemical vapor deposition (CVD). A "Low Pass Filter" 56 is connected in series between the DC power supply 55 and the chuck 13 to supply DC potential without interference with RF energy. Positive DC potential is applied to the anodized chuck 13 to control the flux of positive ions from the plasma 18 to the wafer 16. This positive DC bias modifies the chuck 13 potential near the wafer 16, and the electric field generated by the biased chuck 13. The DC bias has a strong influence on the charged particles impinging on the wafer 16 surface. Applying positive bias to the chuck 13 leads to a decrease of ion flux, which improves the quality and surface roughness of the film by CVD process.

In general, the plasma consists of electrons, ions, neutral radicals, and neutral atoms or molecules. A decrease of ion flux implies that the contribution of neutral radicals of plasma become larger than that of energetic ions. Therefore, the proper control of ion energy and flux can be an effective way to suppress plasma induced damage and film stress.

Also, since the ion energy can be minimized, the reactor of this invention can be applied to the plasma process for damage-sensitive devices such as GaAs or InP compound semiconductor devices. One advantage of this invention is that high plasma densities can be produced with low or controlled ion energy. An RF bias 50 on the substrate 16 is used to draw ions to the substrate 16 at the desired impact energy. Thus, optimum ion energy can be selected—one that is high enough to produce anisotropic etching, but not too high as to cause lattice damage or impurity implantation. Therefore, the plasma reactor 11, 12 of this invention can be applied to the plasma processing of fabrication of III-V semiconductor (GaAs— or InP— based HBT's and HEMT's) and photonic devices (nitride based photonic devices and quantum well lasers). Low ion energy as well as controllability of the ion energy is an essential requirement in the fabrication of these devices.

Thus, the present invention has been described herein with reference to a particular embodiment for a particular application. Those having ordinary skill in the art and access to the present teachings will recognize additional modifications, applications and embodiments within the scope thereof.

It is therefore intended by the appended claims to cover any and all such applications, modifications and embodiments within the scope of the present invention.

Accordingly,

What is claimed is:

1. An antenna for use with a plasma source for an inductively-coupled plasma reactor, said antenna comprising:

first, second and third inductive coils provided on a tube having a top flat surface and a side outer surface, each of said first, second and third inductive coils having a one-half turn upper section on the top flat surface coupled to a common input node on the top flat surface, a single turn or less lower section provided around the side outer surface of the tube and a connection section that connects the one-half turn upper section to the corresponding single turn or less lower section, and the first, second and third inductive coils are provided relative to each other to effect an even distribution of energy from a source received at the common input node, wherein the lower section of the first inductive coil, the lower section of the second inductive coil and the lower section of the third inductive coil all have a separate input node and all have a same radius and are provided in an up-down direction relative to each other such that the lower section of the second inductive coil is provided between the lower section of the first inductive coil and the lower section of the third inductive coil, wherein the input node of the lower section of the first inductive coil, the input node of the second inductive coil and the input node of the lower section of the third inductive coil are all provided on the side outer surface of the tube, wherein an output node of the first inductive coil, an output node of the second inductive coil and an output node of the third inductive coil are all provided on the side outer surface of the tube, wherein the input node of the second inductive coil is offset by 120 degrees relative to the input node of the first inductive coil, and the input node of the third inductive coil is offset by 120 degrees relative to the input node of the second inductive coil, wherein the output node of the second inductive coil is offset by 120 degrees relative to the output node of the first inductive coil, and the output node of the third inductive coil is offset by 120 degrees relative to the output node of the second inductive coil, wherein the connection section of the first inductive coil electrically connects the one-half turn upper section of the first inductive coil to the single turn or less lower section of the first inductive coil, wherein the connection section of the second inductive coil electrically connects the one-half turn upper section of the second inductive coil to the single turn or less lower section of the second inductive coil, and wherein the connection section of the third inductive coil electrically connects the one-half turn upper section of the third inductive coil to the single turn or less lower section of the third inductive coil.

2. The antenna of claim 1, wherein the single turn or less lower section of each of the first, second and third inductive coils are wrapped around the side outer surface of a dielectric tube.

3. The antenna of claim 1, wherein the source is a source of radio frequency (RF) energy.

4. The antenna of claim 3, wherein the input nodes of the first, second and third inductive coils provided around the side outer surface receive the RF energy from the corresponding connection sections.

5. The antenna of claim 1, wherein the output nodes of the first, second and third inductive nodes provided around the side outer surface are provided to ground.

6. An antenna for use with a plasma source for an inductively-coupled plasma reactor, the antenna comprising:

first, second and third inductive coils provided on a top flat surface and a side outer surface, each of said first, second and third inductive coils having a one-half turn upper section on the top flat surface coupled to a common input node on the top flat surface, each of the first, second and third inductive coils having a single turn or less lower section provided around the side outer surface and each of the first, second and third inductive coils having a connection section to electrically connect the one-half turn upper section to the corresponding single turn or less lower section, the first, second and third inductive coils to provide an even distribution of energy based on input of the energy to the common input node on the top flat surface, wherein the lower sections of the first, second and third inductive coils each have a separate input node and each have a same radius, and the lower section of the second inductive coil is provided between the lower section of the first inductive coil and the lower section of the third inductive coil, wherein the input node of the lower section of the first inductive coil, the input node of the lower section of the second inductive coil and the input node of the lower section of the third inductive coil are all provided on the side outer surface, wherein an output node of the first inductive coil, an output node of the second inductive coil and an output node of the third inductive coil are all provided on the side outer surface, wherein the input node of the second inductive coil is offset by 120 degrees relative to the input node of the first inductive coil, and the input node of the third inductive coil is offset by 120 degrees relative to the input node of the second inductive coil, wherein the output node of the second inductive coil is offset by 120 degrees relative to the output node of the first inductive coil, and the output node of the third inductive coil is offset by 120 degrees relative to the output node of the second inductive coil, wherein the connection section of the first inductive coil electrically connects the one-half turn upper section of the first inductive coil to the input node of the single turn or less lower section of the first inductive coil, wherein the connection section of the second inductive coil electrically connects the one-half turn upper section of the second inductive coil to the input node of the single turn or less lower section of the second inductive coil, and wherein the connection section of the third inductive coil electrically connects the one-half turn upper section of the third inductive coil to the input node of the single turn or less lower section of the third inductive coil.

7. The antenna of claim 6, wherein the single turn or less lower section of each of the first, second and third inductive coils are wrapped around the side outer surface of a dielectric tube.

8. The antenna of claim 6, wherein the energy is a radio frequency (RF) energy.

9. The antenna of claim 8, wherein the input nodes of the first, second and third inductive coils provided around the side outer surface receive the RF energy from the corresponding connection sections.

10. The antenna of claim 6, wherein the output nodes of the first, second and third inductive nodes provided around the side outer surface are provided to ground.

* * * * *